US012392031B2

(12) United States Patent
Hashimoto et al.

(10) Patent No.: US 12,392,031 B2
(45) Date of Patent: Aug. 19, 2025

(54) METHOD OF PROCESSING SUBSTRATE, SUBSTRATE PROCESSING APPARATUS, RECORDING MEDIUM, AND METHOD OF MANUFACTURING SEMICONDUCTOR DEVICE

(71) Applicant: KOKUSAI ELECTRIC CORPORATION, Tokyo (JP)

(72) Inventors: Yoshitomo Hashimoto, Toyama (JP); Yoshiro Hirose, Toyama (JP); Kimihiko Nakatani, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 809 days.

(21) Appl. No.: 17/198,604

(22) Filed: Mar. 11, 2021

(65) Prior Publication Data
US 2021/0301396 A1   Sep. 30, 2021

(30) Foreign Application Priority Data
Mar. 24, 2020   (JP) ................. 2020-052020

(51) Int. Cl.
*C23C 16/44* (2006.01)
*H01L 21/02* (2006.01)

(52) U.S. Cl.
CPC ...... *C23C 16/4404* (2013.01); *H01L 21/0217* (2013.01)

(58) Field of Classification Search
CPC ............. C23C 16/4405; C23C 16/345; C23C 16/45527; C23C 16/4404; H01L 21/02211; H01L 21/0217; H01L 21/0228

USPC ......................................... 438/758
See application file for complete search history.

(56) References Cited

U.S. PATENT DOCUMENTS

| | | | |
|---|---|---|---|
| 5,431,964 A | 7/1995 | Rivoire | |
| 6,403,501 B1 | 6/2002 | Hander et al. | |
| 2008/0282976 A1 | 11/2008 | Okada et al. | |
| 2009/0098710 A1 | 4/2009 | Yamazaki | |
| 2009/0115028 A1* | 5/2009 | Shimomura | H01L 27/1214 257/623 |
| 2009/0149032 A1 | 6/2009 | Kameda et al. | |
| 2011/0003461 A1 | 1/2011 | Yamazaki | |
| 2012/0080756 A1 | 4/2012 | Suzuki et al. | |
| 2014/0342489 A1 | 11/2014 | Nasuno et al. | |

(Continued)

FOREIGN PATENT DOCUMENTS

| | | | | |
|---|---|---|---|---|
| CN | 101425449 A | * | 5/2009 | ....... H01L 21/02532 |
| CN | 106356289 A | | 1/2017 | |

(Continued)

OTHER PUBLICATIONS

English Translation of JP-2021150627 to Hashimoto et al. 2021.*

(Continued)

*Primary Examiner* — Nathan W Ha
(74) *Attorney, Agent, or Firm* — Volpe Koenig

(57) ABSTRACT

There is included (a) supplying a fluorine-containing gas to an interior of a process vessel; (b) exhausting the fluorine-containing gas from the interior of the process vessel while maintaining a state in which fluorine is adhered to the interior of the process vessel; and (c) forming a film on a substrate by supplying a film-forming gas to the substrate accommodated in the interior of the process vessel to which the fluorine is adhered.

19 Claims, 4 Drawing Sheets

(56) References Cited

U.S. PATENT DOCUMENTS

| | | |
|---|---|---|
| 2017/0051408 A1 | 2/2017 | Takagi et al. |
| 2017/0122781 A1 | 5/2017 | Oyama et al. |
| 2019/0304797 A1 | 10/2019 | Degai |

FOREIGN PATENT DOCUMENTS

| | | | | |
|---|---|---|---|---|
| JP | 2001-168091 A | 6/2001 | | |
| JP | 2002-222805 A | 8/2002 | | |
| JP | 2000-100729 A | 4/2007 | | |
| JP | 2008283148 A | * 11/2008 | | |
| JP | 2009-124117 A | 6/2009 | | |
| JP | 2009-231794 A | 10/2009 | | |
| JP | 5084343 B2 | 11/2012 | | |
| JP | 2017-083393 A | 5/2017 | | |
| JP | 2021150627 A | * 9/2021 | ........... | C23C 16/345 |
| KR | 2009-0037365 A | 4/2009 | | |
| KR | 2019-0113557 A | 10/2019 | | |
| WO | 2011/001558 A1 | 1/2011 | | |
| WO | 2013/105416 A1 | 7/2013 | | |

OTHER PUBLICATIONS

Korean Office Action issued on Nov. 10, 2022 for Korean Patent Application No. 10-2021-0031917.
Chinese Office Action issued on Jul. 13, 2023 for Chinese Patent Application No. 202011643389.3.
Singapore Written Opinion issued on Sep. 1, 2023 for Singapore Patent Application No. 10202102523V.
Singapore Search Report issued on Jan. 31, 2022 for Singapore Patent Application No. 10202102523V.
Singapore Written Opinion issued on Jan. 31, 2022 for Singapore Patent Application No. 10202102523V.
Taiwan Search Report issued on Jan. 13, 2022 for Taiwan Patent Application No. 110102615.
Japanese Office Action issued on Feb. 8, 2022 for Japanese Patent Application No. 2020-052020.

* cited by examiner

METHOD OF PROCESSING SUBSTRATE, SUBSTRATE PROCESSING APPARATUS, RECORDING MEDIUM, AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2020-052020, filed on Mar. 24, 2020, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film such as a silicon nitride film or the like on a substrate is often carried out.

SUMMARY

The present disclosure provides some embodiments of a technique capable of improving a quality of a film formed on a substrate.

According to one or more embodiments of the present disclosure, there is provided a technique that includes (a) supplying a fluorine-containing gas to an interior of a process vessel; (b) exhausting the fluorine-containing gas from the interior of the process vessel while maintaining a state in which fluorine is adhered to the interior of the process vessel; and (c) forming a film on a substrate by supplying a film-forming gas to the substrate accommodated in the interior of the process vessel to which the fluorine is adhered.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

ONE OR MORE EMBODIMENTS OF THE PRESENT DISCLOSURE

One or more embodiments of the present disclosure will now be described mainly with reference to FIGS. 1 to 4.

(1) Configuration of the Substrate Processing Apparatus

Figure 1:
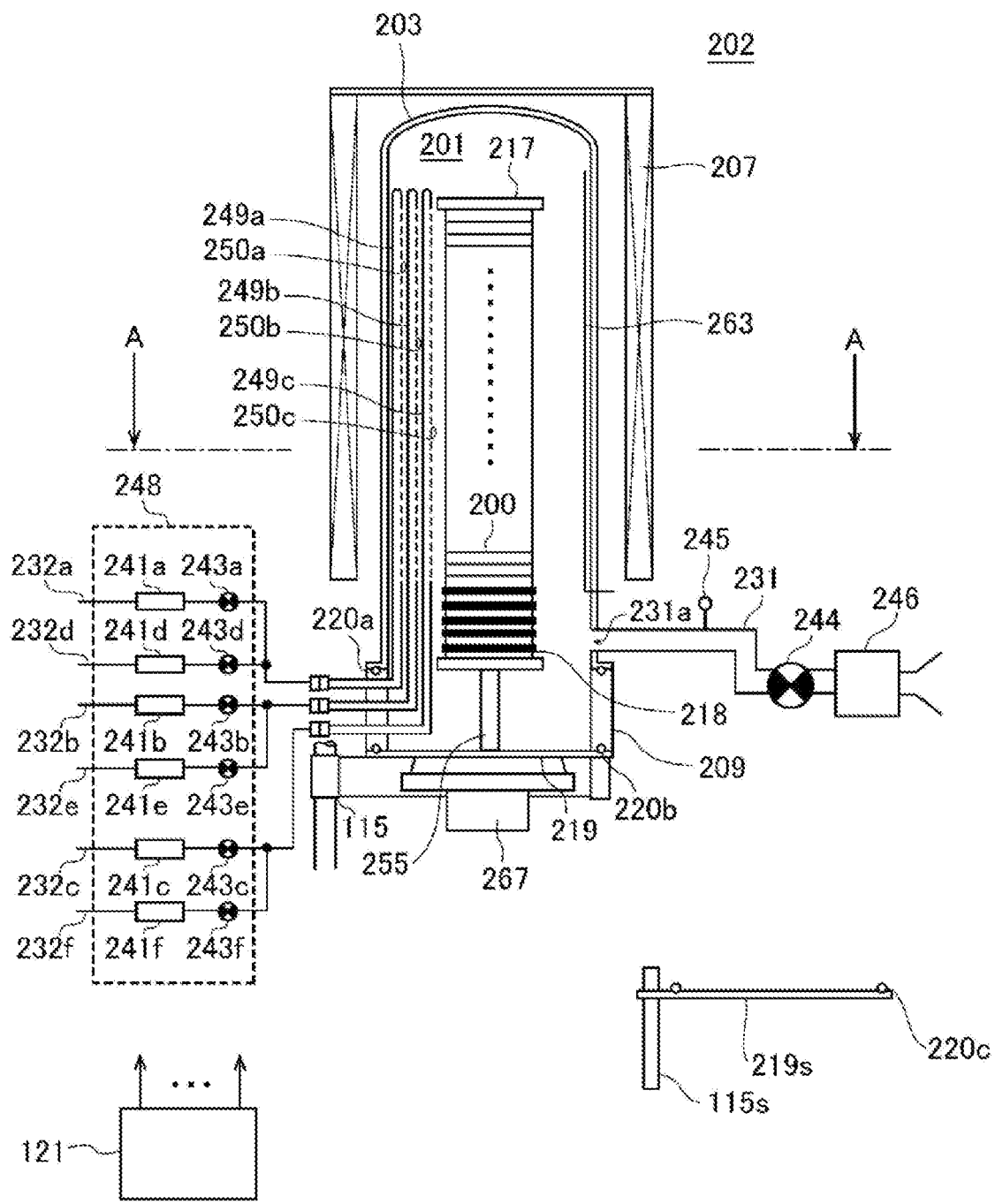
FIG. 1 is a schematic configuration diagram of a vertical type process furnace of a substrate processing apparatus suitably used in one or more embodiments of the present disclosure, in which a portion of a process furnace is shown in a vertical cross sectional view.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material, e.g., quartz ($SiO_2$), silicon carbide (SiC) or the like, and has a cylindrical shape with its upper end closed and its lower end opened. A manifold 209 is disposed below the reaction tube 203 in a concentric relationship with the reaction tube 203. The manifold 209 is made of a metal material such as, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is installed between the manifold 209 and the reaction tube 203. Similar to the heater 207, the reaction tube 203 is vertically installed. A process vessel (reaction vessel) mainly includes the reaction tube 203 and the manifold 209. A process chamber 201 is formed in a hollow cylindrical portion of the process vessel. The process chamber 201 is configured to accommodate wafers 200 as substrates. The process to the wafers 200 is performed in the process chamber 201, i.e., the process vessel.

Nozzles 249a to 249c as first to third supply parts are installed in the process chamber 201 so as to penetrate a sidewall of the manifold 209. The nozzles 249a to 249c will also be referred to as first to third nozzles, respectively. The nozzles 249a to 249c are each made of a heat resistant material such as quartz or SiC. Gas supply pipes 232a to 232c are connected to the nozzles 249a to 249c, respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed in the gas supply pipes 232a to 232c sequentially from the corresponding upstream sides of gas flow, respectively. Gas supply pipes 232d to 232f are connected to the gas supply pipes 232a to 232c at the downstream side of the valves 243a to 243c, respectively. MFCs 241d to 241f and valves 243d to 243f are installed in the gas supply pipes 232d to 232f sequentially from the corresponding upstream sides of gas flow, respectively. The gas supply pipes 232a to 232f are each made of a metal material such as, e.g., stainless steel (SUS) or the like.

Figure 2:
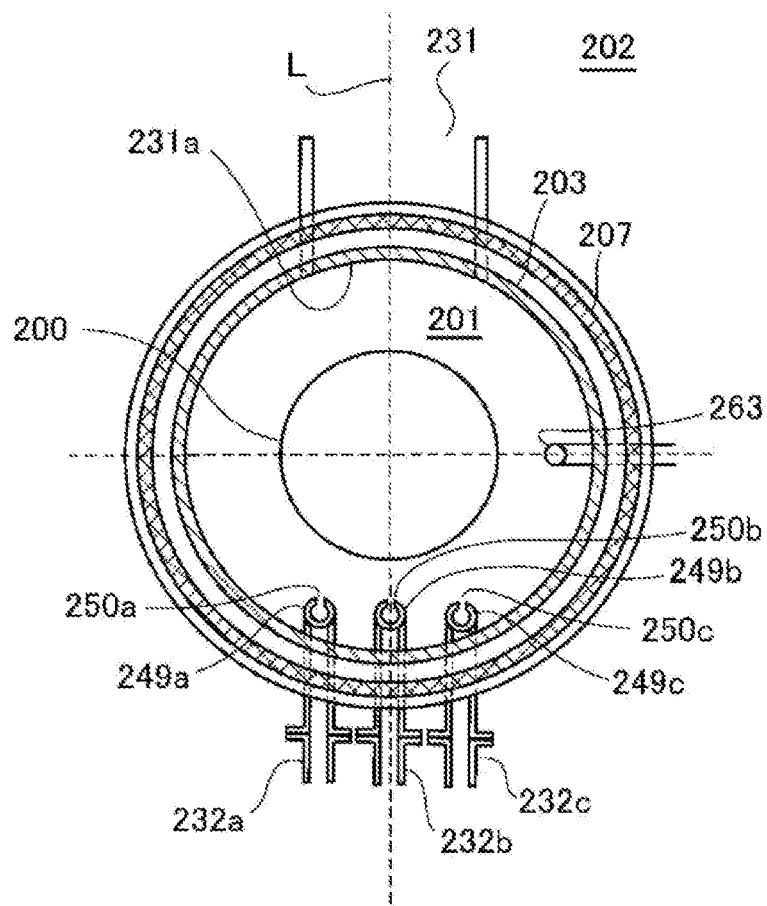
FIG. 2 is a schematic configuration diagram of a vertical type process furnace of the substrate processing apparatus suitably used in one or more embodiments of the present disclosure, in which a portion of the process furnace is shown in a cross sectional view taken along line A-A in FIG. 1.

As illustrated in FIG. 2, the nozzles 249a to 249c are installed in a space with an annular shape in plane view between the inner wall of the reaction tube 203 and the wafers 200 such that the nozzles 249a to 249c extend upward along an arrangement direction of the wafers 200 from a lower portion of the inner wall of the reaction tube 203 to an upper portion of the inner wall of the reaction tube 203. Specifically, the nozzles 249a to 249c are installed at a lateral side of a wafer arrangement region in which the wafers 200 are arranged, namely in a region which horizontally surrounds the wafer arrangement region, so as to extend along the wafer arrangement region. The nozzle 249b is disposed to face an exhaust port 231a as described hereinbelow, on a straight line in plane view, with the centers of the wafers 200 carried into the process chamber 201 interposed therebetween. The nozzles 249a and 249c are disposed so as to sandwich a straight line L passing through the nozzle 249b and the center of the exhaust port 231a from both sides along the inner wall of the reaction tube 203 (the outer peripheral portion of the wafers 200). The straight line L is also a straight line passing through the nozzle 249b and the centers of the wafers 200. That is, it may be said that the nozzle 249c is installed at the opposite side of the nozzle 249a with the straight line L interposed therebetween. The nozzles 249a and 249c are disposed in line symmetry with the straight line L as a symmetry axis. Gas supply holes 250a to 250c which supply a gas are installed on the side surfaces of the nozzles 249a to 249c, respectively. The gas supply holes 250a to 250c are opened to face the exhaust port 231a in plane view, so as to allow a gas to be supplied toward the wafers 200. The gas supply holes 250a to 250c may be formed in a plural number between the lower portion of the reaction tube 203 and the upper portion of the reaction tube 203.

As a precursor gas which is one of the film-forming gases, a gas, which contains, for example, silicon (Si) as a main element constituting a film to be formed on each of the wafers 200, and a halogen element, i.e., a halosilane-based gas, is supplied from the gas supply pipe 232a into the process chamber 201 via the MFC 241a, the valve 243a, and the nozzle 249a. The halosilane-based gas is a Si-containing gas and acts as a Si source. The halogen element includes chlorine (Cl), fluorine (F), bromine (Br), iodine (I), and the like. As the halosilane-based gas, it may be possible to use, for example, a Si- and Cl-containing gas, i.e., a chlorosilane-based gas.

As a reaction gas which is one of the film-forming gases, a hydrogen nitride-based gas containing, for example, nitrogen (N) and hydrogen (H) is supplied from the gas supply pipe 232b into the process chamber 201 via the MFC 241b, the valve 243b, and the nozzle 249b. The hydrogen nitride-based gas is a N-containing gas and acts as a N source (a nitriding gas or a nitriding agent). The hydrogen nitride-based gas will also be referred to as a N- and H-containing gas.

A fluorine-based gas, i.e., a fluorine (F)-containing gas, is supplied from the gas supply pipe 232c into the process chamber 201 via the MFC 241c, the valve 243c, and the nozzle 249c. The F-containing gas acts as a F source, a cleaning gas, a surface treatment gas, or the like.

An inert gas is supplied from the gas supply pipes 232d to 232f into the process chamber 201 via the MFCs 241d to 241f, the valves 243d to 243f, the gas supply pipes 232a to 232c, and the nozzles 249a to 249c. The inert gas acts as a purge gas, a carrier gas, a dilution gas, or the like.

A film-forming gas supply system (a precursor gas supply system or a reaction gas supply system) mainly includes the gas supply pipes 232a and 232b, the MFCs 241a and 241b, and the valves 243a and 243b. A F-containing gas supply system mainly includes the gas supply pipe 232c, the MFC 241c, and the valve 243c. An inert gas supply system mainly includes the gas supply pipes 232d to 232f, the MFCs 241d to 241f, and the valves 243d to 243f.

One or all of various supply systems described above may be configured as an integrated supply system 248 in which the valves 243a to 243f, the MFCs 241a to 241f, and the like are integrated. The integrated supply system 248 is connected to each of the gas supply pipes 232a to 232f so that a supply operation of various kinds of gases into the gas supply pipes 232a to 232f, i.e., an opening/closing operation of the valves 243a to 243f, a flow-rate-adjusting operation by the MFCs 241a to 241f or the like, is controlled by a controller 121 which will be described later. The integrated supply system 248 is configured as an integral type or division type integrated unit, and is also configured so that it is detachable from the gas supply pipes 232a to 232f or the like, so as to perform maintenance, replacement, expansion, or the like of the integrated supply system 248, on an integrated unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas supply holes 250a to 250c) in plane view with the wafers 200 interposed therebetween. The exhaust port 231a may be installed between the lower portion of the sidewall of the reaction tube 203 and the upper portion of the sidewall of the reaction tube 203, i.e., along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an APC (auto pressure controller) valve 244 as a pressure regulator (pressure regulation part). The APC valve 244 is configured so that a vacuum exhaust and a vacuum exhaust stop of the interior of the process chamber 201 can be performed by opening and closing the APC valve 244 while the vacuum pump 246 operates and so that the internal pressure of the process chamber 201 can be adjusted by adjusting an opening degree of the APC valve 244 based on pressure information detected by the pressure sensor 245 while the vacuum pump 246 operates. An exhaust system mainly includes the exhaust pipe 231, the APC valve 244, and the pressure sensor 245. The vacuum pump 246 may be regarded as being included in the exhaust system.

A seal cap 219, which serves as a furnace opening cover configured to hermetically seal a lower end opening of the manifold 209, is installed under the manifold 209. The seal cap 219 is made of a metal material such as, e.g., stainless steel (SUS) or the like, and is formed in a disc shape. An O-ring 220b, which is a seal member making contact with the lower end of the manifold 209, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217.

The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from (out of) the process chamber 201 by moving the seal cap 219 up and down.

A shutter 219s as a furnace opening cover capable of hermetically seal the lower end opening of the manifold 209, with the boat 217 unloaded from the interior of the process chamber 201 by moving the seal cap 219 down, is installed under the manifold 209. The shutter 219s is made of a metal material such as, e.g., stainless steel or the like, and is formed in a disc shape. An O-ring 220c as a seal member making contact with the lower end of the manifold 209 is installed on an upper surface of the shutter 219s. An opening/closing operation (an up-down movement operation or a rotational movement operation) of the shutter 219s is controlled by a shutter-opening/closing mechanism 115s.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat-insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is adjusted such that the interior of the process chamber 201 has a desired temperature distribution. The temperature sensor 263 is installed along the inner wall of the reaction tube 203.

Figure 3:
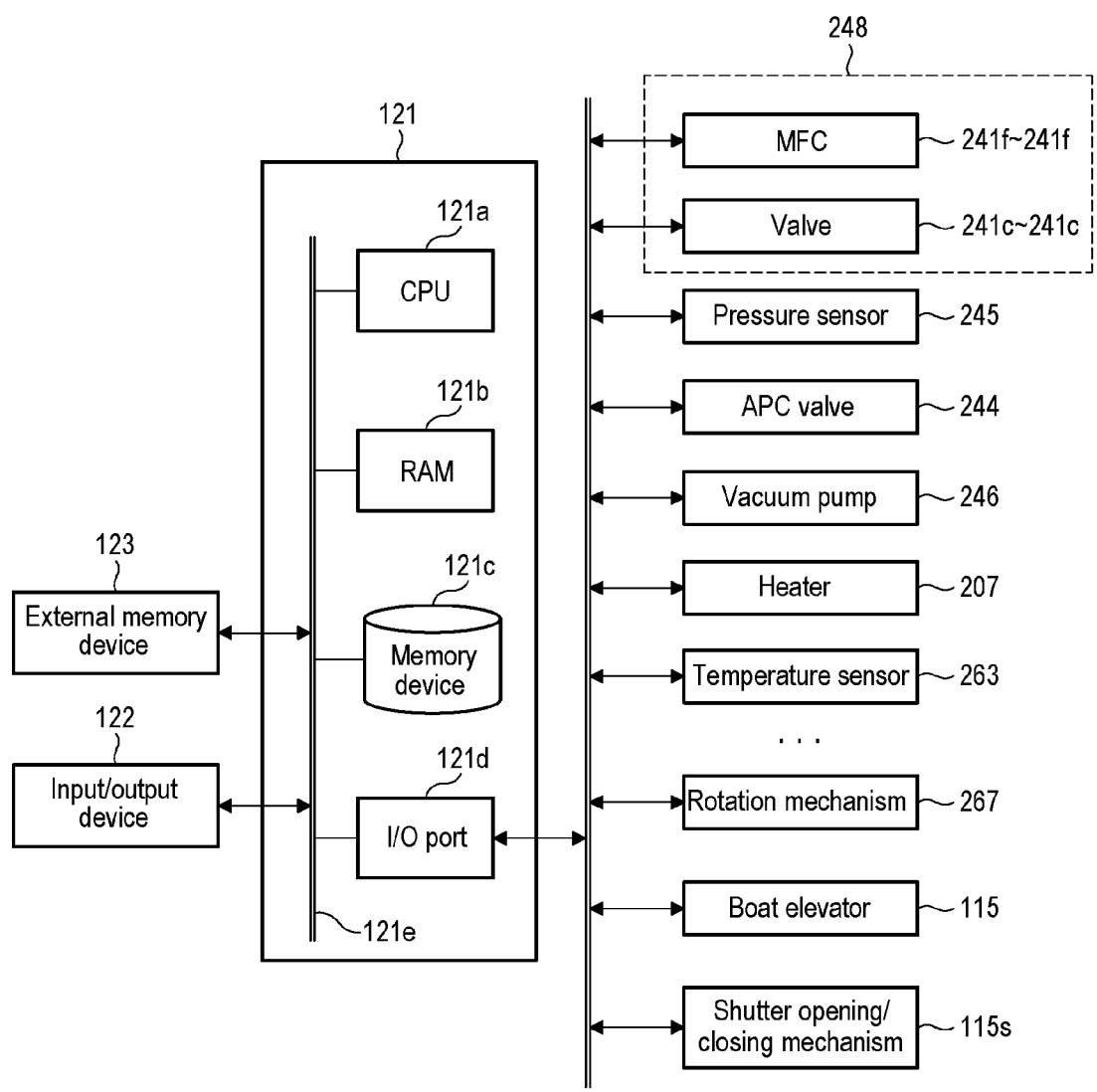
FIG. 3 is a schematic configuration diagram of a controller of the substrate processing apparatus suitably used in one or more embodiments of the present disclosure, in which a control system of the controller is shown in a block diagram.

As illustrated in FIG. 3, the controller 121, which is a control part (control means), may be configured as a computer including a CPU (central processing unit) 121a, a RAM (random access memory) 121b, a memory device 121c, and an I/O port 121d. The RAM 121b, the memory device 121c, and the I/O port 121d are configured to exchange data with the CPU 121a via an internal bus 121e. An input/output device 122 formed of, e.g., a touch panel or the like, is connected to the controller 121.

The memory device 121c is configured by, for example, a flash memory, a HDD (hard disk drive), a SSD (solid state drive), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program, data, or the like read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotation mechanism 267, the boat elevator 115, the shutter-opening/closing mechanism 115s, and the like, as described above.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the flow-rate-adjusting operation of various kinds of gases by the MFCs 241a to 241f, the opening/closing operation of the valves 243a to 243f, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operations of rotating the boat 217 and adjusting the rotation speed of the boat 217 with the rotation mechanism 267, the operation of moving the boat 217 up and down with the boat elevator 115, the operation of opening and closing the shutter 219s with the shutter-opening/closing mechanism 115s, and the like.

The controller 121 may be configured by installing, on the computer, the aforementioned program stored in an external memory device 123. The external memory device 123 may include, for example, a magnetic disc such as a HDD, an optical disc such as a CD, a magneto-optical disc such as a MO, a semiconductor memory such as a USB memory or a SSD, and the like. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Substrate Processing Process

A processing sequence example of forming a film on a wafer 200 as a substrate using the aforementioned substrate processing apparatus, which is one of the processes for manufacturing a semiconductor device, will be described mainly with reference to FIG. 4. In the following descriptions, the operations of the respective parts constituting the substrate processing apparatus are controlled by the controller 121.

Figure 4:
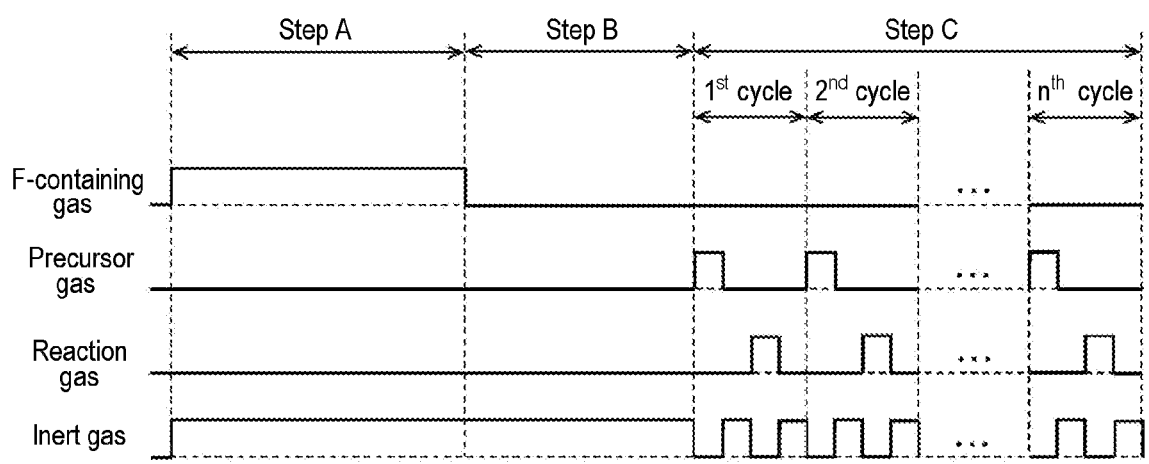
FIG. 4 is a diagram illustrating a processing sequence according to one or more embodiments of the present disclosure.

In the processing sequence illustrated in FIG. 4, there are performed: step (a) of supplying a F-containing gas to an interior of the process vessel (step A); step (b) of exhausting (discharging) the F-containing gas from the interior of the process vessel while maintaining a state in which F is adhered to the interior of the process vessel (step B); and step (c) of forming a film on a wafer 200 by supplying a film-forming gas (a precursor gas or a reaction gas) to the wafer 200 accommodated in the interior of the process vessel to which F is adhered (step C).

Furthermore, in FIG. 4, an example in which at step C, a cycle which non-simultaneously performs step C-1 of supplying the precursor gas to the wafer 200 and step C-2 of supplying the reaction gas to the wafer 200 is implemented a predetermined number of times (n times, where n is an integer of 1 or more) is illustrated.

In addition, in FIG. 4, an example in which at step B, the F-containing gas or the like is discharged from the interior of the process vessel by supplying an inert gas as a purge gas to the interior of the process vessel to purge the interior of the process vessel with the inert gas (hereinafter, referred to as a "PRG") is illustrated.

Moreover, at step B in FIG. 4, the F-containing gas or the like may be discharged from the interior of the process vessel by exhausting (vacuum-exhausting or depressurization-exhausting) the interior of the process vessel without supplying the purge gas to the interior of the process vessel.

In the present disclosure, for the sake of convenience, the processing sequence described above may be denoted as follows. The same denotation will be used in other embodiments and the modifications as described hereinbelow.

F-containing gas→PRG→(precursor gas→reaction gas)×n

When the term "wafer" is used herein, it may refer to a wafer itself or a laminated body of a wafer and a predetermined layer or film formed on the surface of the wafer. In addition, when the phrase "a surface of a wafer" is used herein, it may refer to a surface of a wafer itself or a surface of a predetermined layer or the like formed on a wafer. Furthermore, in the present disclosure, the expression "a predetermined layer is formed on a wafer" may mean that a predetermined layer is directly formed on a surface of a wafer itself or that a predetermined layer is formed on a layer or the like formed on a wafer. In addition, when the term "substrate" is used herein, it may be synonymous with the term "wafer."

[Step A]
(Pressure Regulation and Temperature Adjustment)

The interior of the process vessel in which no wafer 200 is accommodated, namely the interior of the process chamber 201, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information (pressure regulation). Furthermore, the interior of the process chamber 201 is heated by the heater 207 to a desired processing temperature. In this operation, the degree of supplying electric power to the heater 207 is feedback-controlled based on the temperature information detected by the temperature sensor 263 such that the interior of the process chamber 201 has a desired temperature distribution (temperature adjustment). The exhaust and heating of the interior of the process chamber 201 may be continuously performed at least until steps A and B are completed. Furthermore, the state in which no wafer 200 is accommodated in the process chamber 201, namely the state in which no wafer 200 is located in the process chamber 201, may be continued at least until steps A and B are completed. In addition, the boat 217, namely the empty boat 217 in which no wafer 200 is charged, may be accommodated in the process chamber 201 or not. When the empty boat 217 is accommodated in the process chamber 201, the state may be continued at least until steps A and B are completed.

(F-Containing Gas Supply)

After the pressure regulation and the temperature adjustment are completed, a F-containing gas is supplied into the process vessel in which no wafer 200 is accommodated, namely into the process chamber 201.

Specifically, the valve 243c is opened to allow a F-containing gas to flow through the gas supply pipe 232c. The flow rate of the F-containing gas is adjusted by the MFC 241c. The F-containing gas is supplied into the process chamber 201 via the nozzle 249c and is exhausted from the exhaust port 231a. At this time, the F-containing gas is supplied into the process chamber 201. Simultaneously, the valves 243d to 243f are opened to supply an inert gas into the process chamber 201 via the nozzles 249a to 249c, respectively. The supply of the inert gas may not be performed.

The processing condition at this step may be exemplified as follows:

Processing temperature: 100 to 500 degrees C. or 250 to 350 degrees C. in some embodiments
Processing pressure: 1,333 to 40,000 Pa or 1,333 to 16,665 Pa in some embodiments
F-containing gas supply flow rate: 0.5 to 10 slm
Inert gas supply flow rate: 0 to 20 slm
Gas supply time: 1 to 60 minutes or 10 to 20 minutes in some embodiments.

Furthermore, in the present disclosure, the expression of the numerical range such as "100 to 500 degrees C." may mean that a lower limit value and an upper limit value are included in that range. Therefore, for example, "100 to 500 degrees C." may mean "100 degrees C. or higher and 500 degrees C. or lower." The same applies to other numerical ranges.

By supplying the F-containing gas into the process chamber 201 under the aforementioned processing condition, the F-containing gas is brought into contact with the members in the process chamber 201, for example, the inner wall of the reaction tube 203, the inner wall of the manifold 209, the surfaces of the nozzles 249a to 249c, and the like. Thus, the surfaces of the members in the process chamber 201 are treated with the F-containing gas (surface treatment or treatment).

This surface treatment may include cleaning the members in the process chamber 201 by a thermochemical reaction (etching reaction), i.e., removing deposits on the surfaces of the members in the process chamber 201, forming a F-containing layer (metal fluoride layer) as a protective layer by fluorination on the surfaces of the metal members, smoothing (flattening) the surfaces of the quartz members, and the like. In addition, this surface treatment may include a process of physisorbing or chemisorbing F contained in the F-containing gas to the surfaces of the members in the process chamber 201, i.e., a process of adhering F to the surfaces of the members in the process chamber 201.

As the F-containing gas, it may be possible to use, for example, a fluorine ($F_2$) gas, a chlorine trifluoride ($ClF_3$) gas, a chlorine fluoride (ClF) gas, a nitrogen trifluoride ($NF_3$) gas, a nitrosyl fluoride (FNO) gas, a hydrogen fluoride (HF) gas, a tungsten hexafluoride ($WF_6$) gas, a $F_2$ gas+nitrogen oxide (NO) gas, a $ClF_3$ gas+NO gas, a ClF gas+NO gas, a $NF_3$ gas+NO gas, or a mixture thereof, for example, a $F_2$ gas+FNO gas, a $F_2$ gas+HF gas, or the like.

As the inert gas, it may be possible to use, for example, a nitrogen ($N_2$) gas, or a rare gas such as an argon (Ar) gas, a helium (He) gas, a neon (Ne) gas, or a xenon (Xe) gas. This also applies to each step as described hereinbelow.

[Step B]
(Residual Gas Removal)

After step A is completed, the valve 243c is closed to stop the supply of the F-containing gas to the interior of the process chamber 201. Then, the interior of the process chamber 201 is vacuum-exhausted and the F-containing gas, the reaction byproduct, or the like, which remains within the process chamber 201, is removed from the interior of the process chamber 201. At this time, the valves 243d to 243f are opened to supply an inert gas into the process chamber 201 via the nozzles 249a to 249c. The inert gas supplied from the nozzles 249a to 249c acts as a purge gas. Thus, the interior of the process chamber 201 is purged (purge). Furthermore, as described above, the F-containing gas or the like may be discharged from the interior of the process chamber 201 by exhausting (vacuum-exhausting or depressurization-exhausting) the interior of the process chamber 201 without supplying the purge gas to the interior of the process chamber 201.

The processing condition at this step may be exemplified as follows:
Processing temperature: 100 to 500 degrees C. or 250 to 350 degrees C. in some embodiments
Processing pressure: 1 to 1,000 Pa or 100 to 500 Pa in some embodiments
Inert gas supply flow rate: 0 to 10 slm
Gas supply time/vacuum exhaust time: 1 to 300 seconds or 1 to 200 seconds in some embodiments.

By performing at least one selected from the group of the purge and the vacuum exhaust of the interior of the process chamber 201 under the aforementioned processing condition, the F-containing gas, the reaction byproduct, or the like remaining in the process chamber 201 can be removed from the interior of the process chamber 201 while maintaining a state in which F is adhered to the interior of the process vessel, namely to the surfaces of the members in the process chamber 201. That is, the F-containing gas, the reaction byproduct, or the like remaining in the process chamber 201 can be removed from the interior of the process chamber 201 while maintaining a state in which F is physisorbed or chemisorbed to the surfaces of the members in the process chamber 201.

At this time, by adjusting at least one selected from the group of the purge condition and the vacuum exhaust condition, it is possible to adjust the amount of F maintained in the state in which it is adhered to the interior of the process vessel, namely to the surfaces of the members in the process chamber 201. That is, it is possible to adjust the amount of F maintained in the state in which it is physisorbed or chemisorbed to the surfaces of the members in the process chamber 201.

Furthermore, when performing the purge, for example, the lower the processing temperature, the shorter the gas supply time, and the smaller the inert gas supply flow rate, it is possible to increase the amount of F maintained in the state in which it is physisorbed or chemisorbed to the surfaces of the members in the process chamber 201.

In addition, when performing the purge, for example, the higher the processing temperature, the longer the gas supply time, and the larger the inert gas supply flow rate, it is possible to reduce the amount of F maintained in the state in which it is physisorbed or chemisorbed to the surfaces of the members in the process chamber 201.

Moreover, when performing the vacuum exhaust, for example, the lower the processing temperature, the shorter the vacuum exhaust time, and the higher the processing pressure, it is possible to increase the amount of F maintained in the state in which it is physisorbed or chemisorbed to the surfaces of the members in the process chamber 201.

Furthermore, when performing the vacuum exhaust, for example, the higher the process temperature, the longer the vacuum exhaust time, the lower the process pressure, it is possible to reduce the amount of F maintained in the state in which it is physisorbed or chemisorbed to the surfaces of the members in the process chamber 201.

At this step, F maintained in the state in which it is physisorbed or chemisorbed to the interior of the process vessel, namely to the surfaces of the members in the process chamber 201, becomes a F source that mixes (doping) F into a film to be formed at step C.

[Step C]
(Wafer Charging and Boat Loading)

After step B is completed, a plurality of wafers 200 is charged on the boat 217 (wafer charging). After the wafer charging, the shutter 219s is moved by the shutter-opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process vessel to which F is adhered, namely into the process chamber 201 (boat loading). In this state, the seal cap 219 seals the lower end of the manifold 209 via the O-ring 220b. Furthermore, at steps A and B, the wafer charging may be performed in parallel with steps A and B when the empty boat 217 is not accommodated in the process chamber 201.

(Pressure Regulation and Temperature Adjustment)

Thereafter, the interior of the process chamber 201, namely the space in which the wafers 200 exist, is vacuum-exhausted (depressurization-exhausted) by the vacuum pump 246 so as to reach a desired processing pressure (degree of vacuum). In this operation, the internal pressure of the process chamber 201 is measured by the pressure sensor 245. The APC valve 244 is feedback-controlled based on the measured pressure information (pressure regulation).

Furthermore, the wafers 200 in the process chamber 201 are heated by the heater 207 to a desired processing temperature. In this operation, the degree of supplying electric power to the heater 207 is feedback-controlled based on the temperature information detected by the temperature sensor 263 such that the interior of the process chamber 201 has a desired temperature distribution (temperature adjustment). In addition, the rotation of the wafers 200 by the rotation mechanism 267 begins. The exhaust of the interior of the process chamber 201 and the heating and rotation of the wafers 200 may be continuously performed at least until the process to the wafers 200 is completed.

After the pressure regulation and the temperature adjustment are completed, steps C-1 and C-2 are sequentially performed.

[Step C-1]

At this step, a precursor gas is supplied into the process vessel to which F is adhered, namely to the wafer 200 in the process chamber 201.

Specifically, the valve 243a is opened to allow a precursor gas to flow through the gas supply pipe 232a. The flow rate of the precursor gas is adjusted by the MFC 241a. The precursor gas is supplied into the process chamber 201 via the nozzle 249a and is exhausted from the exhaust port 231a. At this time, the precursor gas is supplied to the wafer 200 (precursor gas supply). Simultaneously, the valves 243d to 243f may be opened to supply an inert gas into the process chamber 201 via the nozzles 249a to 249c, respectively.

The processing condition at this step may be exemplified as follows:
- Processing temperature: 250 to 800 degrees C. or 400 to 700 degrees C. in some embodiments
- Processing pressure: 1 to 2,666 Pa or 67 to 1,333 Pa in some embodiments
- Precursor gas supply flow rate: 0.01 to 2 slm or 0.1 to 1 slm in some embodiments
- Inert gas supply flow rate (per gas supply pipe): 0 to 10 slm
- Gas supply time: 1 to 120 seconds or 1 to 60 seconds in some embodiments.

By supplying, for example, a chlorosilane-based gas, as the precursor gas to the wafer 200 under the aforementioned processing condition, a Si-containing layer containing F and Cl is formed on the wafer 200. The Si-containing layer containing F and Cl is formed by physisorption or chemisorption of a precursor to the surface of the wafer 200, chemisorption of a substance ($Si_xCl_y$) from which a portion of a precursor is decomposed, deposition of Si by pyrolysis of precursor, physisorption or chemisorption of F desorbed from the surfaces of the members in the process chamber 201, or the like. The Si-containing layer containing F and Cl may be an adsorption layer (a physical adsorption layer or a chemical adsorption layer) containing a precursor, $Si_xCl_y$, or F, or may be a deposition layer of Si containing Cl or F. In the present disclosure, the Si-containing layer containing F and Cl will be simply referred to as a Si-containing layer. Furthermore, when the precursor gas is supplied to the wafer 200, F is desorbed from the surfaces of the members in the process chamber 201 to be introduced (doped) into the Si-containing layer.

After the Si-containing layer is formed on the surface of the wafer 200, the valve 243a is closed to stop the supply of the precursor gas to the interior of the process chamber 201. Then, the interior of the process chamber 201 is vacuum-exhausted and the gas or the like, which remains in the process chamber 201, is removed from the interior of the process chamber 201. At this time, the valves 243d to 243f are opened to supply an inert gas into the process chamber 201 via the nozzles 249a to 249c. The inert gas supplied from the nozzles 249a to 249c acts as a purge gas. Thus, the interior of the process chamber 201 is purged (purge).

As the precursor gas (film-forming gas), it may be possible to use a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane gas, i.e., a silicon tetrachloride ($SiCl_4$, abbreviation: STC) gas, a hexachlorodisilane ($Si_2Cl_6$, abbreviation: HCDS) gas, an octachlorotrisilane ($Si_3Cl_8$, abbreviation: OCTS) gas or the like, a bromosilane-based gas such as a tetrabromosilane ($SiBr_4$) gas or the like, or an iodosilane-based gas such as a tetraiodosilane ($SiI_4$) gas or the like.

[Step C-2]

At this step, a reaction gas is supplied into the process vessel to which F is adhered, namely to the wafer 200 in the process chamber 201. To be precise, a reaction gas is supplied to the Si-containing layer formed on the surface of the wafer 200.

Specifically, the valve 243b is opened to allow a reaction gas to flow through the gas supply pipe 232b. The flow rate of the reaction gas is adjusted by the MFC 241b. The reaction gas is supplied into the process chamber 201 via the nozzle 249b and is exhausted from the exhaust port 231a. At this time, the reaction gas is supplied to the wafer 200 (reaction gas supply). Simultaneously, the valves 243d to 243f may be opened to supply an inert gas into the process chamber 201 via the nozzles 249a to 249c, respectively.

The processing condition at this step may be exemplified as follows:
- Processing temperature: 250 to 800 degrees C. or 400 to 700 degrees C. in some embodiments
- Processing pressure: 1 to 4,000 Pa or 1 to 1,333 Pa in some embodiments
- Reaction gas supply flow rate: 0.01 to 20 slm
- Inert gas supply flow rate (per gas supply pipe): 0 to 10 slm
- Gas supply time: 1 to 120 seconds or 1 to 60 seconds in some embodiments.

By supplying, for example, a hydrogen nitride-based gas as the reaction gas to the wafer 200 under the aforementioned processing condition, at least a portion of the Si-containing layer formed on the surface of the wafer 200 is nitrided (modified). As the Si-containing layer is nitrided, a layer containing F, Si, and N, i.e., a silicon nitride layer (SiN layer) containing F, is formed on the surface of the wafer 200. In the present disclosure, the SiN layer containing F will be simply referred to as a SiN layer. When forming the SiN layer, an impurity such as Cl or the like contained in the Si-containing layer constitutes a gaseous substance containing at least Cl in the process of nitriding the Si-containing layer with the reaction gas and is discharged from the interior of the process chamber 201. Thus, the SiN layer becomes a layer having a smaller amount of impurity such as Cl or the like than the Si-containing layer formed at step C-1. Furthermore, F contained in the SiN layer may be desorbed from the surfaces of the members in the process chamber 201 at step C-2 to include F introduced into the SiN layer, in addition to F introduced into the Si-containing layer formed at step C-1.

After the SiN layer is formed on the surface of the wafer 200, the valve 243b is closed to stop the supply of the reaction gas into the process chamber 201. Then, the gas or the like, which remains in the process chamber 201, is removed from the interior of the process chamber 201 according to the same processing procedures as those of the purge at step C-1 (purge).

As the reaction gas (film-forming gas), it may be possible to use, for example, a hydrogen nitride-based gas such as an ammonia ($NH_3$) gas, a diazene ($N_2H_2$) gas, a hydrazine ($N_2H_4$) gas, a $N_3H_8$ gas, or the like.

[Performing a Predetermined Number of Times]

A cycle which non-simultaneously, i.e., non-synchronously, performs steps C-1 and C-2 described above is implemented a predetermined number of times (n times, where n is an integer of 1 or more), whereby a silicon nitride film (SiN film) containing F can be formed on the surface of the wafer 200. In the present disclosure, the SiN film containing F will be simply referred to as a SiN film. The aforementioned cycle may be repeated multiple times. That is, the thickness of the SiN layer formed per one cycle may be set smaller than a desired film thickness, and the aforementioned cycle may be repeated multiple times until the film thickness of the film formed by laminating the SiN layer becomes equal to the desired film thickness.

In addition, the aforementioned processing condition at step C is a condition under which F adhered to the interior of the process vessel, i.e., F physisorbed or chemisorbed to the interior of the process vessel, is desorbed. That is, steps C-1 and C-2 may be performed while desorbing F adhered to the interior of the process vessel by performing step C under the aforementioned processing condition. Furthermore, by performing steps C-1 and C-2 while desorbing F adhered to the interior of the process vessel, F desorbed from the interior of the process vessel can be introduced into the Si-containing layer formed at step C-1, and F desorbed from the interior of the process vessel can be introduced into the SiN layer formed at step C-2. As a result, F can be introduced into the SiN film formed at step C. That is, F can be doped into the SiN film formed on the surface of the wafer 200 by performing step C under the processing condition in which F physisorbed or chemisorbed to the interior of the process vessel is desorbed.

In addition, a F concentration in the SiN film formed on the surface of the wafer 200 can be controlled by adjusting at least one selected from the group of the purge condition and the vacuum exhaust condition at step B.

That is, the amount of F maintained in the state in which it is adhered to the interior of the process vessel, i.e., the amount of F maintained in the state in which it is physisorbed or chemisorbed to the interior of the process vessel, can be adjusted by adjusting at least one selected from the group of the purge condition and the vacuum exhaust condition at step B. Thus, the F concentration in the SiN film formed on the surface of the wafer 200 at step C can be controlled.

Furthermore, when performing the purge at step B, for example, the lower the processing temperature, the shorter the gas supply time, and the smaller the inert gas supply flow rate, it is possible to increase the amount of F maintained in the state in which it is physisorbed or chemisorbed to the interior of the process vessel, to increase the amount of F introduced into the SiN film formed at step C, and to control the F concentration in the SiN film in a direction of increasing the concentration.

In addition, when performing the purge at step B, for example, the higher the processing temperature, the longer the gas supply time, and the larger the inert gas supply flow rate, it is possible to reduce the amount of F maintained in the state in which it is physisorbed or chemisorbed to the interior of the process vessel, to reduce the amount of F introduced into the SiN film formed at step C, and to control the F concentration in the SiN film in a direction of reducing the concentration.

Furthermore, when performing the vacuum exhaust at step B, for example, the lower the process temperature, the shorter the vacuum exhaust time, and the higher the processing pressure, it is possible to increase the amount of F maintained in the state in which it is physisorbed or chemisorbed to the interior of the process vessel, to increase the amount of F introduced into the SiN film formed at step C, and to control the F concentration in the SiN film in the direction of increasing the concentration.

Moreover, when performing the vacuum exhaust at step B, for example, the higher the process temperature, the longer the vacuum exhaust time, and the lower the process pressure, it is possible to reduce the amount of F maintained in the state in which it is physisorbed or chemisorbed to the interior of the process vessel, to reduce the amount of F introduced into the SiN film formed at step C, and to control the F concentration in the SiN film in the direction of reducing the concentration.

By adjusting at least one selected from the group of the purge condition and the vacuum exhaust condition at step B in this way, the F concentration in the SiN film formed on the surface of the wafer 200 at step C can be controlled to become a predetermined concentration of, for example, $3.0 \times 10^{18}$ atoms/cm$^3$ or more and $1.0 \times 10^{22}$ atoms/cm$^3$ or less. Furthermore, the F concentration in the SiN film can be controlled to become a predetermined concentration of, for example, $1.0 \times 10^{20}$ atoms/cm$^3$ or more and $1.0 \times 10^{22}$ atoms/cm$^3$ or less. In addition, the F concentration in the SiN film can be controlled to become a predetermined concentration of, for example, $2.0 \times 10^{20}$ atoms/cm$^3$ or more and $1.0 \times 10^{22}$ atoms/cm$^3$ or less. Furthermore, the F concentration in the SiN film can be controlled to become a predetermined concentration of, for example, $2.0 \times 10^{20}$ atoms/cm$^3$ or more and $5.0 \times 10^{21}$ atoms/cm$^3$ or less.

(After-Purge and Atmospheric Pressure Return)

After the formation of the SiN film containing F on the surface of the wafer 200 is completed, the inert gas as a purge gas is supplied from each of the nozzles 249a to 249c into the process chamber 201 and is exhausted from the exhaust port 231a. Thus, the interior of the process chamber 201 is purged, and the gas or the reaction byproduct, which remains in the process chamber 201, is removed from the interior of the process chamber 201 (after-purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

Thereafter, the seal cap 219 is moved down by the boat elevator 115 to open the lower end of the manifold 209. Then, the processed wafers 200 supported on the boat 217 are unloaded from the lower end of the manifold 209 to the outside of the reaction tube 203 (boat unloading). After the boat unloading, the shutter 219s is moved so that the lower end opening of the manifold 209 is sealed by the shutter 219s via the O-ring 220c (shutter closing). The processed wafers 200 are unloaded to the outside of the reaction tube 203 and are subsequently discharged from the boat 217 (wafer discharging).

Furthermore, a cycle which includes sequentially performing steps A, B, and C described above is implemented a predetermined number of times (m times, where m is an integer of 1 or more), whereby a batch process of forming a SiN film doped with F on the surfaces of the wafers 200 can be performed a predetermined number of times. This cycle may be repeated multiple times (where m is set to an integer of 2 or more). That is, as in the processing sequence illustrated below, steps A and B are sequentially performed in advance every time step C is performed once, performing steps A, B, and C is set as one cycle, and this cycle may be performed multiple times.

[F-containing gas→PRG→(precursor gas→reaction gas)×n]×m

Thus, the F concentration in the SiN film can be made uniform between batch processes. That is, it is possible to improve the uniformity and reproducibility of F concentration in the SiN film between batch processes.

For example, when step C is continuously performed three times after performing steps A and B, the F concentration in the SiN film formed at the third step C becomes lower than the F concentration in the SiN film formed at the first step C, making it difficult to uniformize the F concentration in the SiN film between batch processes. On the other hand, by repeating the cycle which includes sequentially performing steps A, B, and C multiple times, it is possible to make the F concentration in the SiN film uniform between batch processes, and to improve the uniformity and reproducibility of F concentration in the SiN film between batch processes.

When the cycle which includes sequentially performing steps A, B, and C described above is repeated multiple times, it is desirable that the time until starting step C after performing step A be set constant for each cycle. Thus, it is possible to make the F concentration in the SiN film more uniform between batch processes. That is, it is possible to further improve the uniformity and reproducibility of F concentration in the SiN film between batch processes.

For example, if the time until starting step C after performing step A is set different for each cycle, the amount of F desorbed from the interior of the process vessel until starting step C, i.e., the amount of F maintained in the state in which it is adhered to the interior of the process vessel, may vary between batch processes. In this case, the F concentration in the SiN film formed at step C varies between batch processes. On the other hand, by setting the time until starting step C after performing step A constant for each cycle, it is possible to suppress the variation of the amount of F desorbed from the interior of the process vessel until starting step C, i.e., the amount of F maintained in the state in which it is adhered to the interior of the process vessel, between batch processes, to make the F concentration in the SiN film uniform between batch processes, and to improve the uniformity and reproducibility of F concentration in the SiN film between batch processes.

Furthermore, when the cycle which includes sequentially performing steps A, B, and C described above is repeated multiple times, it is desirable that the time until starting step C after performing step A be set less than or equal to the time until starting step A after performing step C. Thus, it is possible to suppress the reduction of F concentration in the SiN film.

For example, if the time until starting step C after performing step A is set longer than the time until starting step A after performing step C, F may be desorbed from the interior of the process vessel until starting step C to reduce the amount of F maintained in the state in which it is adhered to the interior of the process vessel. In this case, the F concentration in the SiN film formed at step C is reduced. On the other hand, by setting the time until starting step C after performing step A less than or equal to the time until starting step A after performing step C, it is possible to reduce the amount of F desorbed from the interior of the process vessel until starting step C, to suppress the reduction of the amount of F maintained in the state in which it is adhered to the interior of the process vessel, and to suppress the reduction of F concentration in the SiN film.

Furthermore, when the cycle which includes sequentially performing steps A, B, and C described above is repeated multiple times, it is desirable that the time until starting step C after performing step A be set shorter than the time until starting step A after performing step C. Thus, it is possible to further suppress the reduction of F concentration in the SiN film.

For example, if the time until starting step C after performing step A is set longer than the time until starting step A after performing step C, F may be desorbed from the interior of the process vessel until starting step C to reduce the amount of F maintained in the state in which it is adhered to the interior of the process vessel. In this case, the F concentration in the SiN film formed at step C is reduced. On the other hand, by setting the time until starting step C after performing step A shorter than the time until starting step A after performing step C, it is possible to reduce the amount of F desorbed from the interior of the process vessel until starting step C, to suppress the reduction of the amount of F maintained in the state in which it is adhered to the interior of the process vessel, and to suppress the reduction of F concentration in the SiN film.

(3) Effects According to the Present Embodiments

According to the present embodiments, one or more effects as set forth below may be achieved.

(a) By performing steps A to C, it is possible to allow the SiN film formed on the wafer 200 to be doped with a predetermined concentration of F and to improve the quality of the SiN film formed on the wafer 200. For example, it is possible to reduce dielectric constant of the film by the doping of a predetermined concentration of F into the SiN film. Furthermore, it is possible to repair defects in the film and to terminate dangling bonds in the film by F. The defects or dangling bonds tend to more frequently occur on the interface between the film and its base, but according to the present method, particularly, it is possible to increase the F concentration on the interface between the film and the base and to effectively perform the repair thereof.

Furthermore, according to the present method, it is possible to increase not only the F concentration on the interface between the film and the base but also the F concentration on the outermost surface of the film. That is, it is possible to make the F concentration on the interface (lower end surface) between the film and the base and the F concentration on the outermost surface (upper end surface) of the film higher than that in the other portions of the film, i.e., in portions other than the lower end surface and the upper end surface of the film. Thus, particularly, it is possible to effectively perform the repair of the defects or dangling bonds on the interface between the film and the base, the defects or dangling bonds on the outermost surface of the film, or the like.

(b) By performing steps A and B, a step of directly supplying the F-containing gas to the wafer 200 is not required at step C, and thus the Si-containing layer, the SiN layer, and the SiN film formed at step C can be doped with F without causing etching damage. Furthermore, by performing steps A and B, it is possible to appropriately control the F concentration in the SiN film.

(c) By adjusting at least one selected from the group of the purge condition and the vacuum exhaust condition at step B, it is possible to adjust the amount of F maintained in the state in which it is adhered to the interior of the process vessel, i.e., to the surfaces of the members in the process chamber 201. That is, it is possible to adjust the amount of F maintained in the state in which it is physisorbed or chemisorbed to the surfaces of the members in the process chamber 201. This makes it possible to control the F concentration in the SiN film formed at step C. That is, by adjusting at least one selected from the group of the purge condition and the vacuum exhaust condition at step B, it is possible to control the F concentration in the SiN film formed on the surface of the wafer 200 at step C.

(d) By repeating the cycle which includes sequentially performing steps A to C multiple times, i.e., by sequentially performing steps A and B in advance every time step C is performed once, setting performing steps A to C as one cycle, and repeating this cycle multiple times, it is possible to improve the uniformity and reproducibility of F concentration in the SiN film formed at step C between batch processes.

(e) When the cycle which includes sequentially performing steps A to C is repeated multiple times, by setting the time until starting step C after performing step A constant for each cycle, it is possible to further improve the uniformity and reproducibility of F concentration in the SiN film formed at step C between batch processes.

(f) When the cycle which includes sequentially performing steps A to C is repeated multiple times, by setting the time until starting step C after performing step A less than or equal to the time until starting step A after performing step C, it is possible to suppress the reduction of F concentration in the SiN film formed at step C.

Other Embodiments of the Present Disclosure

While one or more embodiments of the present disclosure have been specifically described above, the present disclosure is not limited to the aforementioned embodiments but may be variously modified without departing from the spirit of the present disclosure.

For example, at step C, in addition to the halosilane-based gas described above, an aminosilane-based gas such as a tris-dimethylaminosilane (SiH[N(CH$_3$)$_2$]$_3$, abbreviation: 3DMAS) gas, a silicon hydride gas such as a monosilane (SiH$_4$) gas, or a halogen metal gas such as a titanium tetrachloride (TiCl$_4$) gas may be used as the precursor gas. Furthermore, for example, in addition to the N- and H-containing gas, an O-containing gas such as an oxygen (O$_2$) gas, a N- and C-containing gas such as a triethylamine ((C$_2$H$_5$)$_3$N, abbreviation: TEA) gas, a C-containing gas such as a propylene (C$_3$H$_6$) gas, a boron-containing gas such as a trichloroborane (BCl$_3$) gas, or the like may be used as the reaction gas. A plurality of precursor gases (e.g., a precursor gas 1, a precursor gas 2, and a precursor gas 3) and a plurality of reaction gases (e.g., a reaction gas 1, a reaction gas 2, and reaction gas 3) may be used in combination.

Moreover, in addition to a F-doped semiconductor thin film such as a silicon oxide film (SiO film), a silicon oxynitride film (SiON film), a silicon carbonitride film (SiCN film), a silicon oxycarbonitride film (SiOCN film), a silicon oxycarbide film (SiOC film), a silicon boronitride film (SiBN film), a silicon borocarbonitride film (SiBCN film), a boronitride film (BN film), or a borocarbonitride film (BCN film) doped with F, a F-doped metal film such as a titanium nitride film (TiN film), a titanium oxide film (TiO film), or a titanium oxynitride film (TiON film) doped with F may be formed on the surface of the wafer 200 by the processing sequence described above and the processing sequences illustrated below.

[F-containing gas→PRG→(precursor gas→reaction gas 1→reaction gas 2)×n]×m

[F-containing gas→PRG→(precursor gas→reaction gas 1→reaction gas 2→reaction gas 3)×n]×m

[F-containing gas→PRG→(precursor gas 1→precursor gas 2→reaction gas)×n]×m

[F-containing gas→PRG→(precursor gas 1→precursor gas 2→precursor gas 3→reaction gas)×n]×m

[F-containing gas→PRG→(precursor gas 1→precursor gas 2→reaction gas 1→reaction gas 2)×n]×m Recipes used in each processing may be prepared individually according to the processing contents and may be stored in the memory device 121c via a telecommunication line or the external memory device 123. Moreover, at the start of each processing, the CPU 121a may properly select an appropriate recipe from the recipes stored in the memory device 121c according to the processing contents. Thus, it is possible for a single substrate processing apparatus to form films of different kinds, composition ratios, qualities, and thicknesses with enhanced reproducibility. In addition, it is possible to reduce an operator's burden and to quickly start each processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there has been described an example in which films are formed using a batch-type substrate processing apparatus capable of processing a plurality of substrates at a time. The present disclosure is not limited to the aforementioned embodiments but may be appropriately applied to, e.g., a case where films are formed by using a single-wafer-type substrate processing apparatus capable of processing a single substrate or several substrates at a time. In addition, in the aforementioned embodiments, there has been described an example in which films are formed by using the substrate processing apparatus provided with a hot-wall-type process furnace. The present disclosure is not limited to the aforementioned embodiments but may be appropriately applied to a case where films are formed by using a substrate processing apparatus provided with a cold-wall-type process furnace.

In the case of using these substrate processing apparatuses, each processing may be performed by the processing procedures and processing conditions similar to those of the aforementioned embodiments. Effects similar to those of the aforementioned embodiments may be achieved.

The embodiments described above may be appropriately combined with one another. The processing procedures and processing conditions at this time may be similar to, for example, the processing procedures and processing conditions of the aforementioned embodiments.

Example

A SiN film doped with F was formed on a wafer by the processing sequences and the processing conditions according to the aforementioned embodiments by using the substrate processing apparatus according to the aforementioned embodiments. At that time, a plurality of evaluation samples of the F-doped SiN film were prepared by changing the processing conditions at step B. The thickness of the F-doped SiN film in each evaluation sample was set to 20 nm. Then, a F concentration in the F-doped SiN film in each evaluation sample was measured by SIMS.

As a result, the F concentration in the F-doped SiN film in a certain evaluation sample was $3.0 \times 10^{18}$ atoms/cm$^3$ or more and $1.0 \times 10^{22}$ atoms/cm$^3$ or less. The F concentration in the F-doped SiN film in another evaluation sample was $1.0 \times 10^{20}$ atoms/cm$^3$ or more and $1.0 \times 10^{22}$ atoms/cm$^3$ or less. The F concentration in the F-doped SiN film in yet another evaluation sample was $2.0 \times 10^{20}$ atoms/cm$^3$ or more and $1.0 \times 10^{22}$ atoms/cm$^3$ or less. The F concentration in the F-doped SiN film in yet another evaluation sample was $2.0 \times 10^{20}$ atoms/cm$^3$ or more and $5.0 \times 10^{21}$ atoms/cm$^3$ or less.

Furthermore, even in the F-doped SiN film in any evaluation sample, it was confirmed that the F concentration on the interface (lower end surface) between the SiN film and its base and the F concentration on the outermost surface (upper end surface) of the SiN film become higher than the F concentration in the other portions of the SiN film, i.e., in portions other than the lower end surface and the upper end surface of the SiN film. Thus, particularly, it was confirmed that it is possible to effectively perform the repair of defects or dangling bonds on the interface between the SiN film and the base and of defects or dangling bonds on the outermost surface of the film, or the like.

According to the present disclosure in some embodiments, it is possible to provide a technique capable of improving a quality of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) supplying a fluorine-containing gas to an interior of a process vessel such that fluorine is adhered to the interior of the process vessel;
   (b) after (a), exhausting the fluorine-containing gas from the interior of the process vessel while maintaining a state in which the fluorine is adhered to the interior of the process vessel by supplying a purge gas to the interior of the process vessel under a purge condition; and
   (c) after (b) forming a film on the substrate by supplying a film-forming gas to the substrate accommodated in the interior of the process vessel to which the fluorine is adhered, such that the fluorine adhered to the process vessel is introduced into the film,
   wherein (b) includes adjusting the purge condition to adjust an amount of the fluorine adhered to the interior of the process vessel such that a concentration of the fluorine in the film formed in (c) is controlled to a predetermined concentration.

2. The method according to claim 1, wherein in (c), the film-forming gas is supplied under a condition in which the fluorine adhered to the interior of the process vessel is desorbed.

3. The method according to claim 1, wherein in (c), the fluorine adhered to the interior of the process vessel is desorbed to be introduced into the film.

4. The method according to claim 1, wherein in (b), an exhaust condition when the fluorine-containing gas is exhausted from the interior of the process vessel is adjusted to control the concentration of the fluorine in the film formed on the substrate in (c).

5. The method according to claim 1, wherein in (b), the state in which the fluorine adhered to the interior of the process vessel is maintained by maintaining a state in which fluorine is physisorbed or chemisorbed to the interior of the process vessel.

6. The method according to claim 1, wherein a cycle which includes sequentially performing (a), (b), and (c) is repeated multiple times.

7. The method according to claim 1, wherein (a) and (b) are sequentially performed in advance every time (c) is performed once, performing (a), (b), and (c) is set as one cycle, and the one cycle is repeated multiple times.

8. The method according to claim 6, wherein a time until starting (c) after performing (a) is set constant for each cycle.

9. The method according to claim 6, wherein a time until starting (c) after performing (a) is set shorter than or equal to a time until starting (a) after performing (c).

10. The method according to claim 6, wherein a time until starting (c) after performing (a) is set shorter than a time until starting (a) after performing (c).

11. The method according to claim 1, wherein (a) is performed in a state in which the substrate does not exist in the process vessel.

12. The method according to claim 1, wherein in (a), cleaning of the interior of the process vessel is performed.

13. The method according to claim 1, wherein the predetermined concentration is $3.0\times10^{18}$ atoms/cm$^3$ or more and $1.0\times10^{22}$ atoms/cm$^3$ or less.

14. The method according to claim 1, wherein the predetermined concentration is $1.0\times10^{20}$ atoms/cm$^3$ or more and $1.0\times10^{22}$ atoms/cm$^3$ or less.

15. The method according to claim 1, wherein the predetermined concentration is $2.0\times10^{20}$ atoms/cm$^3$ or more and $1.0\times10^{22}$ atoms/cm$^3$ or less.

16. The method according to claim 1, wherein in (c), wherein the predetermined concentration is $2.0\times10^{20}$ atoms/cm$^3$ or more and $5.0\times10^{21}$ atoms/cm$^3$ or less.

17. A method of manufacturing a semiconductor device, comprising:
   processing the substrate by performing the method of claim 1.

18. A substrate processing apparatus, comprising:
   a process vessel in which a substrate is processed;
      a fluorine-containing gas supply system configured to supply a fluorine-containing gas to an interior of the process vessel;
      a film-forming gas supply system configured to supply a film-forming gas to the substrate in the process vessel;
      an exhaust system configured to exhaust the interior of the process vessel; and
   a controller configured to be capable of controlling the fluorine-containing gas supply system, the film-forming gas supply system, and the exhaust system so as to perform a process, the process including:
      (a) supplying the fluorine-containing gas to the interior of the process vessel such that fluorine is adhered to the interior of the process vessel;
      (b) after (a), exhausting the fluorine-containing gas from the interior of the process vessel while maintaining a state in which the fluorine is adhered to the interior of the process vessel by supplying a purge gas to the interior of the process vessel under a purge condition; and
      (c) after (b), forming a film on the substrate by supplying the film-forming gas to the substrate accommodated in the interior of the process vessel to which the fluorine is adhered, such that the fluorine adhered to the process vessel is introduced into the film,
      wherein (b) includes adjusting the purge condition to adjust an amount of the fluorine adhered to the interior of the process vessel such that a concentration of the fluorine in the film formed in (c) is controlled to a predetermined concentration.

19. A non-transitory computer-readable recording medium storing a program that causes, by a computer, a substrate processing apparatus to perform a process, the process comprising:
   (a) supplying a fluorine-containing gas to an interior of a process vessel of the substrate processing apparatus such that fluorine is adhered to the interior of the process vessel;
   (b) after (a), exhausting the fluorine-containing gas from the interior of the process vessel while maintaining a state in which the fluorine is adhered to the interior of the process vessel by supplying a purge gas to the interior of the process vessel under a purge condition; and (c) after (b) forming a film on a substrate by supplying a film-forming gas to the substrate accommodated in the interior of the process vessel to which the fluorine is adhered, such that the fluorine adhered to the process vessel is introduced into the film, wherein (b) includes adjusting the purge condition to adjust an amount of the fluorine adhered to the interior of the process vessel such that a concentration of the fluorine in the film formed in (c) is controlled to a predetermined concentration.

* * * * *